United States Patent
Xia et al.

(10) Patent No.: US 9,531,855 B2
(45) Date of Patent: *Dec. 27, 2016

(54) SYSTEM AND METHOD OF ARBITRATING AUDIO SOURCE STREAMED BY MOBILE APPLICATIONS

(71) Applicant: Ford Global Technologies, LLC, Dearborn, MI (US)

(72) Inventors: Yiping Xia, Shanghai (CN); Douglas VanDagens, Beverly Hills, MI (US); Edward Andrew Pleet, Livonia, MI (US); Julius Marchwicki, Detroit, MI (US); Doron M. Elliott, Detroit, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/842,943

(22) Filed: Sep. 2, 2015

(65) Prior Publication Data

US 2015/0373175 A1    Dec. 24, 2015

Related U.S. Application Data

(63) Continuation of application No. 13/761,486, filed on Feb. 7, 2013, now Pat. No. 9,146,899.

(51) Int. Cl.

| | |
|---|---|
| H04W 4/02 | (2009.01) |
| H04M 1/57 | (2006.01) |
| G06F 17/00 | (2006.01) |
| H04M 1/60 | (2006.01) |
| H03G 3/30 | (2006.01) |

(Continued)

(52) U.S. Cl.
CPC ............. *H04M 1/57* (2013.01); *G06F 17/00* (2013.01); *H03G 3/3005* (2013.01); *H03G 3/3089* (2013.01); *H04M 1/6091* (2013.01); *H04R 27/00* (2013.01); *H04M 2250/02* (2013.01); *H04R 2420/01* (2013.01); *H04R 2430/01* (2013.01); *H04R 2499/13* (2013.01); *H04W 4/046* (2013.01)

(58) Field of Classification Search
CPC .................. H04W 4/046; H04W 4/02
USPC ............. 455/515, 434, 557, 569.2, 452.1, 517,455/3.06, 67.11, 42.2
See application file for complete search history.

(56) References Cited

U.S. PATENT DOCUMENTS

| | | |
|---|---|---|
| 6,233,468 B1 | 5/2001 | Chen |
| 6,526,335 B1 | 2/2003 | Treyz et al. |

(Continued)

*Primary Examiner* — John J Lee
(74) *Attorney, Agent, or Firm* — Jennifer M. Stec; Brooks Kushman P.C.

(57) ABSTRACT

A system for attenuating vehicle audio for mobile application audible statements, the system comprising a vehicle computing system having one or more processors for playing audio in the vehicle from a plurality of different audio sources. The system also includes a wireless transceiver for communicating signals from a mobile computing device for processing by the vehicle computing system. The vehicle computing system is configured to receive a wireless signal from the mobile computing device representative of an audible statement to be played in the vehicle. If the vehicle computing system is playing audio in the vehicle at the time the wireless signal is received from the mobile computing device, determine an amount to attenuate the audio based on the source of the audio. Attenuate the audio and play the audible statement based on the determination.

20 Claims, 3 Drawing Sheets

(51) Int. Cl.
*H04R 27/00* (2006.01)
*H04W 4/04* (2009.01)

(56) References Cited

U.S. PATENT DOCUMENTS

| | | |
|---|---|---|
| 6,564,056 B1 | 5/2003 | Fitzgerald |
| 6,778,073 B2 | 8/2004 | Lutter et al. |
| 6,970,940 B1 | 11/2005 | Vogel et al. |
| 6,992,583 B2 | 1/2006 | Muramatsu |
| 7,207,041 B2 | 4/2007 | Elson et al. |
| 7,251,330 B2 | 7/2007 | Terao et al. |
| 7,266,435 B2 | 9/2007 | Wang et al. |
| 7,386,393 B2 | 6/2008 | Zabel et al. |
| 7,505,784 B2 | 3/2009 | Barbera |
| 7,602,782 B2 | 10/2009 | Doviak et al. |
| 7,706,551 B2 * | 4/2010 | Falcon .................. H04S 7/00 381/104 |
| 7,801,941 B2 | 9/2010 | Conneely et al. |
| 2002/0098853 A1 | 7/2002 | Chrumka |
| 2002/0098878 A1 | 7/2002 | Mooney et al. |
| 2003/0079123 A1 | 4/2003 | Mas Ribes |
| 2003/0147534 A1 | 8/2003 | Ablay et al. |
| 2004/0101145 A1* | 5/2004 | Falcon .................. H04S 7/00 381/64 |
| 2004/0137925 A1 | 7/2004 | Lowe et al. |
| 2004/0203660 A1 | 10/2004 | Tibrewal et al. |
| 2004/0260438 A1 | 12/2004 | Chernetsky et al. |
| 2004/0267585 A1 | 12/2004 | Anderson et al. |
| 2005/0091408 A1 | 4/2005 | Parupudi et al. |
| 2005/0177635 A1 | 8/2005 | Schmidt et al. |
| 2006/0150197 A1 | 7/2006 | Werner |
| 2006/0156315 A1 | 7/2006 | Wood et al. |
| 2006/0190097 A1 | 8/2006 | Rubenstein |
| 2006/0287787 A1 | 12/2006 | Engstrom et al. |
| 2006/0287821 A1 | 12/2006 | Lin |
| 2007/0016362 A1 | 1/2007 | Nelson |
| 2007/0042809 A1 | 2/2007 | Angelhag |
| 2007/0042812 A1 | 2/2007 | Basir |
| 2007/0050854 A1 | 3/2007 | Cooperstein et al. |
| 2007/0132572 A1 | 6/2007 | Itoh et al. |
| 2007/0140187 A1 | 6/2007 | Rokusek et al. |
| 2007/0294625 A1 | 12/2007 | Rasin et al. |
| 2008/0019440 A1 | 1/2008 | Lee et al. |
| 2008/0148374 A1 | 6/2008 | Spaur et al. |
| 2008/0220718 A1 | 9/2008 | Sakamoto et al. |
| 2008/0313050 A1 | 12/2008 | Basir |
| 2009/0075624 A1 | 3/2009 | Cox et al. |
| 2009/0106036 A1 | 4/2009 | Tamura et al. |
| 2009/0117890 A1 | 5/2009 | Jacobsen et al. |
| 2009/0228908 A1 | 9/2009 | Margis et al. |
| 2009/0253466 A1 | 10/2009 | Saito et al. |
| 2009/0318119 A1 | 12/2009 | Basir |
| 2010/0063670 A1 | 3/2010 | Brzezinski et al. |
| 2010/0094996 A1 | 4/2010 | Samaha |
| 2010/0098853 A1 | 4/2010 | Hoffmann et al. |
| 2010/0216509 A1 | 8/2010 | Riemer et al. |
| 2010/0234071 A1 | 9/2010 | Shabtay et al. |
| 2010/0273417 A1 | 10/2010 | Tian et al. |
| 2010/0306309 A1 | 12/2010 | Santori et al. |
| 2011/0014871 A1 | 1/2011 | Sato et al. |
| 2011/0105097 A1 | 5/2011 | Tadayon et al. |
| 2011/0112762 A1 | 5/2011 | Gruijters et al. |
| 2011/0143726 A1 | 6/2011 | de Silva |
| 2011/0195659 A1 | 8/2011 | Boll et al. |
| 2011/0296037 A1 | 12/2011 | Westra et al. |
| 2012/0054300 A1 | 3/2012 | Marchwicki et al. |
| 2012/0079002 A1 | 3/2012 | Boll et al. |
| 2012/0196583 A1 | 8/2012 | Kindo |

* cited by examiner

SYSTEM AND METHOD OF ARBITRATING AUDIO SOURCE STREAMED BY MOBILE APPLICATIONS

CROSS-REFERENCE TO RELATED APPLICATIONS

This application is a continuation of U.S. application Ser. No. 13/761,486 filed Feb. 7, 2013, the disclosure of which is hereby incorporated in its entirety by reference herein.

TECHNICAL FIELD

The illustrative embodiments generally relate to an apparatus and method for arbitrating or mixing audio streamed by a mobile device.

BACKGROUND

Below, a few prior art entertainment systems are described. Additional devices usage of these systems may be obtained and described from the identified references below.

U.S. Pat. No. 6,778,073 discloses a vehicle audio system includes a wireless audio sensor configured to wirelessly detect different portable audio sources brought into the vehicle. Audio output devices are located in the vehicle for outputting audio signals from the different audio sources. A processor selectively connects the different audio sources to the different audio output devices. In another aspect, the audio system includes object sensors that detect objects located outside the vehicle. The processor generates warning signals that are output from the different audio output devices according to where the objects are detected by the object sensors.

U.S. Patent Application No. 2011/0014871 discloses a wireless communication terminal comprising a network communication unit, short distance wireless communication unit, an input unit and a control unit. The network communication unit transmits radio signals to communication network via a base station. The short distance wireless communication unit transmits radio signals to and from an external device. The short distance wireless communication unit establishes a voice link between the wireless communication terminal and the external device to transmit sound data. The input unit inputs a volume control instruction. The control unit controls the short distance wireless communication unit to send a signal based on the volume control instruction if the voice channel is established between the wireless communication terminal and the external device.

U.S. Pat. No. 7,251,330 discloses a content playback system for sharing content possessed by many users who each hold a token of encrypted content, the content playback system including a playback requesting apparatus which holds a token and which requests the playback of the encrypted content, and a temporary playback apparatus for performing the playback of the encrypted content in response to a playback request of the content. The temporary playback apparatus transmits a token sending request in a form in which an identifier of the content and a digital signature are attached. The playback requesting apparatus returns the token to the temporary playback apparatus only when an authentication procedure for the digital signature is successful.

SUMMARY

A first illustrative embodiment discloses a system for attenuating vehicle audio for mobile application audible statements, the system comprising a vehicle computing system having one or more processors for playing audio in the vehicle from a plurality of different audio sources. The system also includes a wireless transceiver for communicating signals from a mobile computing device for processing by the vehicle computing system. The vehicle computing system is configured to receive a wireless signal from the mobile computing device representative of an audible statement to be played in the vehicle, if the vehicle computing system is playing audio in the vehicle at the time the wireless signal is received from the mobile computing device, determine an amount to attenuate the audio based on the source of the audio, and attenuate the audio and play the audible statement.

A second illustrative embodiment discloses a method for attenuating an audio source in the vehicle for playback of mobile application statements, the method comprising playing audio in the vehicle from one of a plurality of different audio sources. The method also includes the step of receiving a wireless signal at the vehicle from the mobile computing device representative of an audible statement to be played in the vehicle, determining an amount to attenuate the playing audio source based on the source of the playing audio and attenuating the playing audio and playing the audible statement.

A third illustrative embodiment discloses a vehicle computing system comprising a wireless transceiver communicating with a mobile device and a processor configured to play audio from one of multiple audio sources. The processor is also configured to receive an instruction to be output from the mobile device. The processor is further configured to determine an amount to attenuate the playing audio based on the audio source, attenuate the audio, and play the instruction.

DETAILED DESCRIPTION

Detailed embodiments of the present invention are disclosed herein. It is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting.

The invention now will be described more fully hereinafter with reference to the accompanying drawings, in which embodiments of the invention are shown. This invention, may however, be embodied in many different forms and should not be construed as limited to the embodiments set forth herein. Like numbers refer to elements throughout. As used herein the term "and/or" includes any and all combinations of one or more of the associated listed items.

Many new features and functionality are packed into our phones, tablets, MP3 players, etc. However, many of these features are not developed with the vehicle environment in mind. Increasing interoperability of mobile devices with a vehicle's computing system allows customers to have a seamless experience whether or not they are in a vehicle environment. One illustrative example of a seamless customer experience is allowing the navigation application on a user's nomadic device to interact with a vehicle's computing system. Rather than have turn by turn voice prompts and directions played over the mobile device's speakers, the mobile device may be able to utilize the vehicle's speakers to output directions and voice prompts. This can also eliminate the scenario of a vehicle's speakers playing audio over a mobile device's voice prompt or directions, which can cause the driver to miss an important maneuver. It also may allow the driver to completely ignore the mobile device's voice prompts or directions in a scenario when the user may want to ignore the directions, such as, but not limited to, during a phone conversation.

Figure 1:
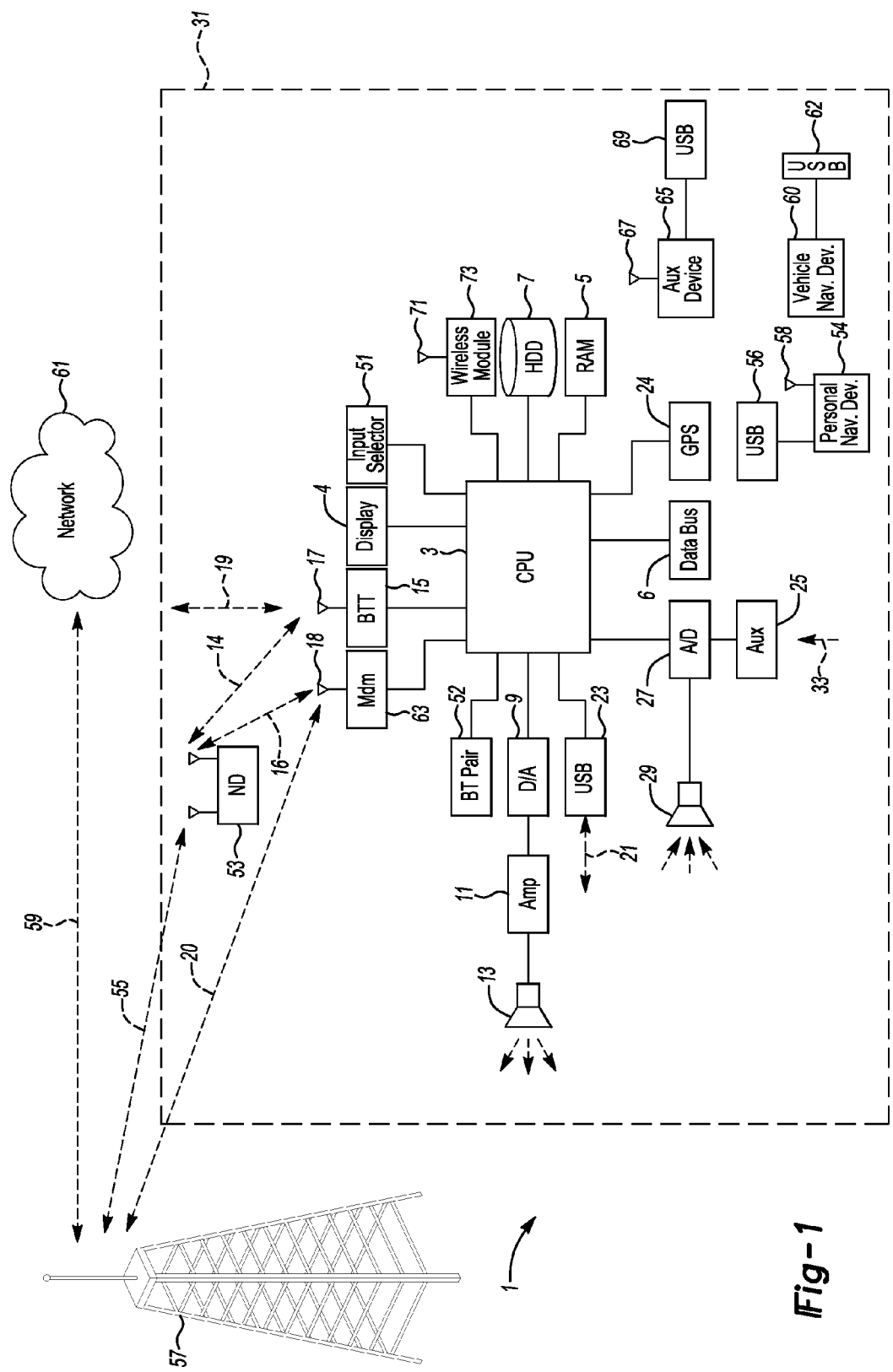
FIG. 1 shows an example block topology for a vehicle based computing system for a vehicle.

FIG. 1 illustrates an example block topology for a vehicle based computing system 1 (VCS) for a vehicle 31. An example of such a vehicle-based computing system 1 is the SYNC system manufactured by FORD MOTOR COMPANY. A vehicle enabled with a vehicle-based computing system may contain a visual front end interface 4 located in the vehicle. The user may also be able to interact with the interface if it is provided, for example, with a touch sensitive screen. In another illustrative embodiment, the interaction occurs through, button presses, spoken dialog system with automatic speech recognition and speech synthesis.

In the illustrative embodiment 1 shown in FIG. 1, a processor 3 controls at least some portion of the operation of the vehicle-based computing system. Provided within the vehicle, the processor allows onboard processing of commands and routines. Further, the processor is connected to both non-persistent 5 and persistent storage 7. In this illustrative embodiment, the non-persistent storage is random access memory (RAM) and the persistent storage is a hard disk drive (HDD) or flash memory.

The processor is also provided with a number of different inputs allowing the user to interface with the processor. In this illustrative embodiment, a microphone 29, an auxiliary input 25 (for input 33), a USB input 23, a GPS input 24 and a BLUETOOTH input 15 are all provided. An input selector 51 is also provided, to allow a user to select between various inputs. Input to both the microphone and the auxiliary connector is converted from analog to digital by a converter 27 before being passed to the processor. Although not shown, these and other components may be in communication with the VCS over a vehicle multiplex network (such as, but not limited to, a CAN bus) to pass data to and from the VCS (or components thereof).

Outputs to the system can include, but are not limited to, a visual display 4 and a speaker 13 or stereo system output. The speaker is connected to an amplifier 11 and receives its signal from the processor 3 through a digital-to-analog converter 9. Output can also be made to a remote BLUETOOTH device such as PND 54 or a USB device such as vehicle navigation device 60 along the bi-directional data streams shown at 19 and 21 respectively.

In one illustrative embodiment, the system 1 uses the BLUETOOTH transceiver 15 to communicate 17 with a user's nomadic device 53 (e.g., cell phone, smart phone, PDA, or any other device having wireless remote network connectivity). The nomadic device can then be used to communicate 59 with a network 61 outside the vehicle 31 through, for example, communication 55 with a cellular tower 57. In some embodiments, tower 57 may be a WiFi access point.

Exemplary communication between the nomadic device and the BLUETOOTH transceiver is represented by signal 14.

Pairing a nomadic device 53 and the BLUETOOTH transceiver 15 can be instructed through a button 52 or similar input. Accordingly, the CPU is instructed that the onboard BLUETOOTH transceiver will be paired with a BLUETOOTH transceiver in a nomadic device.

Data may be communicated between CPU 3 and network 61 utilizing, for example, a data-plan, data over voice, or DTMF tones associated with nomadic device 53. Alternatively, it may be desirable to include an onboard modem 63 having antenna 18 in order to communicate 16 data between CPU 3 and network 61 over the voice band. The nomadic device 53 can then be used to communicate 59 with a network 61 outside the vehicle 31 through, for example, communication 55 with a cellular tower 57. In some embodiments, the modem 63 may establish communication 20 with the tower 57 for communicating with network 61. As a non-limiting example, modem 63 may be a USB cellular modem and communication 20 may be cellular communication.

In one illustrative embodiment, the processor is provided with an operating system including an API to communicate with modem application software. The modem application software may access an embedded module or firmware on the BLUETOOTH transceiver to complete wireless communication with a remote BLUETOOTH transceiver (such as that found in a nomadic device). Bluetooth is a subset of the IEEE 802 PAN (personal area network) protocols. IEEE 802 LAN (local area network) protocols include WiFi and have considerable cross-functionality with IEEE 802 PAN. Both are suitable for wireless communication within a vehicle. Another communication means that can be used in this realm is free-space optical communication (such as IrDA) and non-standardized consumer IR protocols.

In another embodiment, nomadic device 53 includes a modem for voice band or broadband data communication. In the data-over-voice embodiment, a technique known as frequency division multiplexing may be implemented when the owner of the nomadic device can talk over the device while data is being transferred. At other times, when the owner is not using the device, the data transfer can use the whole bandwidth (300 Hz to 3.4 kHz in one example). While frequency division multiplexing may be common for analog cellular communication between the vehicle and the internet, and is still used, it has been largely replaced by hybrids of Code Domain Multiple Access (CDMA), Time Domain Multiple Access (TDMA), Space-Domain Multiple Access (SDMA) for digital cellular communication. These are all ITU IMT-2000 (3G) compliant standards and offer data rates up to 2 mbs for stationary or walking users and 385 kbs for users in a moving vehicle. 3G standards are now being replaced by IMT-Advanced (4G) which offers 100 mbs for users in a vehicle and 1 gbs for stationary users. If the user has a data-plan associated with the nomadic device, it is possible that the data-plan allows for broad-band transmission and the system could use a much wider bandwidth (speeding up data transfer). In still another embodiment, nomadic device 53 is replaced with a cellular communication device (not shown) that is installed to vehicle 31. In yet another embodiment, the ND 53 may be a wireless local area network (LAN) device capable of communication over, for example (and without limitation), an 802.11g network (i.e., WiFi) or a WiMax network.

In one embodiment, incoming data can be passed through the nomadic device via a data-over-voice or data-plan, through the onboard BLUETOOTH transceiver and into the vehicle's internal processor 3. In the case of certain temporary data, for example, the data can be stored on the HDD or other storage media 7 until such time as the data is no longer needed.

Additional sources that may interface with the vehicle include a personal navigation device 54, having, for example, a USB connection 56 and/or an antenna 58, a vehicle navigation device 60 having a USB 62 or other connection, an onboard GPS device 24, or remote navigation system (not shown) having connectivity to network 61. USB is one of a class of serial networking protocols. IEEE 1394 (FireWire™ (Apple), i.LINK™ (Sony), and Lynx™ (Texas Instruments)), EIA (Electronics Industry Association) serial protocols, IEEE 1284 (Centronics Port), S/PDIF (Sony/Philips Digital Interconnect Format) and USB-IF (USB Implementers Forum) form the backbone of the device-device serial standards. Most of the protocols can be implemented for either electrical or optical communication.

Further, the CPU could be in communication with a variety of other auxiliary devices 65. These devices can be connected through a wireless 67 or wired 69 connection. Auxiliary device 65 may include, but are not limited to, personal media players, wireless health devices, portable computers, nomadic device, key fob and the like.

Also, or alternatively, the CPU could be connected to a vehicle based wireless router 73, using for example a WiFi (IEEE 803.11) 71 transceiver. This could allow the CPU to connect to remote networks in range of the local router 73.

In another embodiment, the CPU may be in communication with an audio control module. The CPU may send various can messages directed to the audio control module that is indicative of the amount of attenuation that is required.

In addition to having exemplary processes executed by a vehicle computing system located in a vehicle, in certain embodiments, the exemplary processes may be executed by a computing system in communication with a vehicle computing system. Such a system may include, but is not limited to, a wireless device (e.g., and without limitation, a mobile phone) or a remote computing system (e.g., and without limitation, a server) connected through the wireless device. Collectively, such systems may be referred to as vehicle associated computing systems (VACS). In certain embodiments particular components of the VACS may perform particular portions of a process depending on the particular implementation of the system. By way of example and not limitation, if a process has a step of sending or receiving information with a paired wireless device, then it is likely that the wireless device is not performing the process, since the wireless device would not "send and receive" information with itself. One of ordinary skill in the art will understand when it is inappropriate to apply a particular VACS to a given solution. In all solutions, it is contemplated that at least the vehicle computing system (VCS) located within the vehicle itself is capable of performing the exemplary processes.

Figure 2:
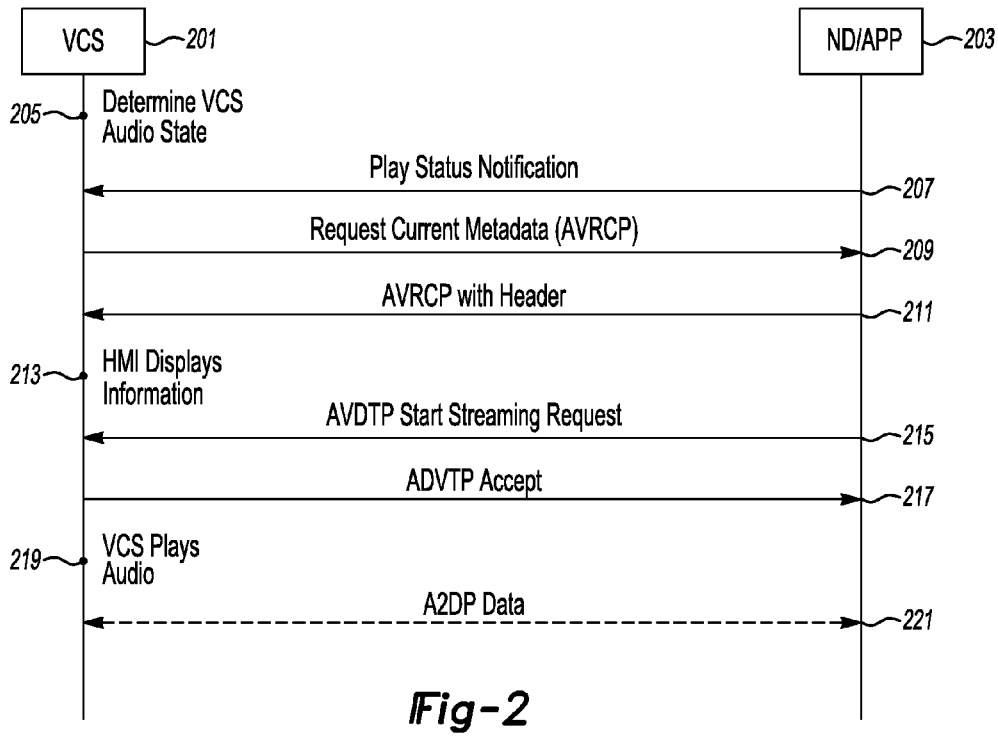
FIG. 2 shows an example use case of a vehicle based computing system interfacing with a nomadic device or an application by utilizing audio video remote control profile (AVRCP).

FIG. 2 shows an illustrative use case of a VCS interfacing with an application by utilizing Audio/Video remote Control Profile (AVRCP). The method described in FIG. 2 may utilize asynchronous data mapped over Bluetooth's Logical Link Control and Adaptation Protocol (L2CAP) layer utilizing asynchronous connection-oriented logical transport (ACL) packets. Asynchronous data may utilize start and stop bits to signify the beginning bit and the end bit. Asynchronous data may be used when data is sent. This may allow a receiver to recognize when the second packet of information is being sent. The application layer of the Bluetooth protocol may be utilized to help facilitate the audio arbitration.

A head unit 201 or vehicle computing system (VCS) 201 may be connected with a nomadic device 203 that is utilizing an application, such as but not limited to a navigation application. Upon connection, the nomadic device and VCS may interact with each other for various reasons, such as but not limited to, streaming music, hands-free calling, a navigation application, etc. The nomadic device and VCS may need to communicate with one another in order to arbitrate the applications audio with the audio source currently utilized on the VCS.

The VCS may determine the audio state condition 205 that the VCS is utilizing in order to arbitrate the audio. Some non-limiting examples of the audio state condition include, but are not limited to, a phone call, AM, FM, CD, Aux, USB, iPod, BT audio, etc. It is also possible that the audio state of the VCS is nonexistent and that no audio source is currently playing. For example, the vehicle's radio may be off or muted, and nothing is being played through the speakers or output by the amplifier. Audio arbitration may be handled differently based on the audio source, dependent on the VCS's execution.

The nomadic device or an application may send a play status notification 207 to the VCS. The play status notification may request to utilize the vehicle speakers or request to open the audio channel. The VCS may then request the nomadic device or application to supply the current metadata 209 via the Audio Video Remote Control Profile (AVRCP). The nomadic device/application may then send data/metadata to the VCS utilizing AVRCP 211. Prior to sending the data, the nomadic device may need to convert the data into metadata to pass through via AVRCP. For example, the nomadic device may convert different contents into metadata, such as a playlist, track, title, album cover, etc. The metadata may include a header indicating it is a certified application requesting to utilize the VCS. The data may also include other information for various uses to be displayed by the VCS 213. For example, in one non-limiting embodiment, the metadata may include turn by turn (TBT) information to indicate an upcoming maneuver on the vehicle's display. For example, the TBT information may include data to indicate the type of turn to take, the street to take the turn on, the distance until the turn, or guidance announcement information. In other illustrative examples, traffic or weather information may be included in the metadata to be displayed by the VCS.

The VCS may utilize an API to determine exactly how the VCS should utilize the data dependent on the condition state of the vehicle. In another example, the VCS may utilize a look-up table to determine exactly which traffic map to utilize for the current scenario. In another scenario, the nomadic device and the VCS may utilize customized messaging via AVRCP to utilize the data that is being communicated. Dependent on the current audio mode of the VCS and the current data that is being streamed by the nomadic device, different situations may arise as to how the audio is presented to the user.

Upon receiving the contents of the data, the VCS may analyze the data or metadata. The VCS may utilize an API, look-up table, or another similar software method to determine how to utilize the data. The VCS's HMI may then display various information, such as turn by turn information, upon receiving the data. In one example, the VCS may receive data indicating that the nomadic device is requesting to display turn by turn directions. The VCS may utilize an API to determine exactly how the VCS should display the turn by turn directions on the current HMI screen that is being utilized by the users of the vehicle. In another example, the VCS may receive data indicative of a traffic map that may be utilized as an overlay of the current HMI screen. The VCS may utilize a look-up table to determine exactly which traffic map to utilize for the current scenario. In another scenario, the nomadic device and the VCS may utilize customized messaging via AVRCP to utilize the data that is being communicated. Dependent on the current HMI display of the VCS and the current data that is being streamed by the nomadic device, the different situations may arise as to how the data is presented to the user.

The metadata may also include other information for various uses to be display by the VCS. For example, in one non-limiting illustrative embodiment, the metadata may include turn by turn (TBT) information to indicate an upcoming maneuver on the vehicle's display. For example, the TBT information may include data to indicate the type of turn to take, the street to take the turn on, the distance until the turn, or guidance announcement information. In other illustrative examples, traffic or weather information may be included in the metadata to be displayed by the VCS.

The VCS may then receive the data that may include the header and/or the other information, such as TBT data. The VCS may analyze the header to determine that it is authorized to utilize the components of the VCS. For example, the VCS may deny utilization of an application if the header does not match the expectation of the VCS. If the VCS receives the appropriate header, the application and nomadic device may allow data to for utilization of the VCS.

Once verified, the VCS may utilize the Audio/Video Distribution Transport Protocol (AVDTP) to start streaming the request 215. AVDTP may define audio/video stream negotiation, establishment, and transmission procedures. AVDTP may be utilized to apply point-to-point signaling over a connection-oriented L2CAP channel. The AVDTP request may be accepted 217 based on the header which is sent via AVRCP. If the AVDTP information has been verified, the VCS may allow for audio to be played from the nomadic device 219. The nomadic device and application may send the audio data via the advanced audio distribution profile (A2DP) to the VCS 221. Some illustrative examples of audio data that may be streamed by the application include guidance for maneuvers or traffic information. For example, the nomadic device may stream audio stating "Make a right turn in 300 feet onto Michigan Avenue." In another illustrative example, the nomadic device may stream audio stating "Traffic is flowing freely on the Southfield Freeway."

Figure 3:
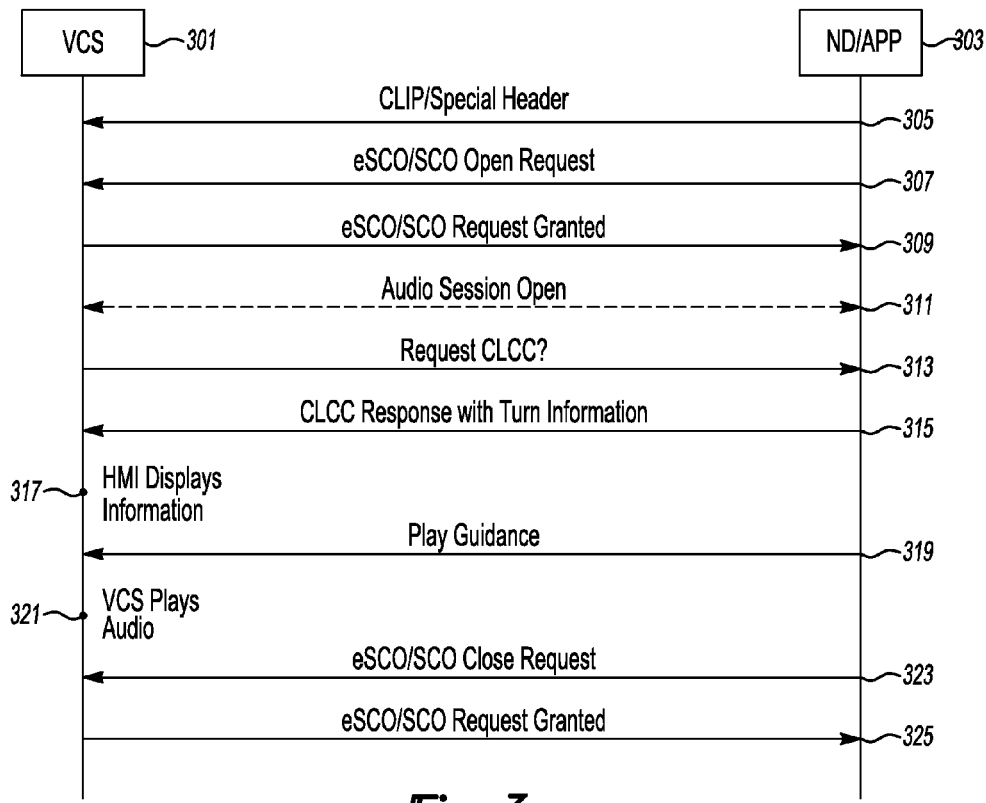
FIG. 3 shows an example use case of a vehicle based computing system interfacing with an application by utilizing enhanced synchronous connection-oriented links (eSCO) or synchronous connection-oriented links (SCO) method.

FIG. 3 depicts an illustrative use case of a VCS 301 interfacing with a nomadic device or application 303 by utilizing enhanced synchronous connection-oriented links (eSCO) and synchronous connection-oriented links (SCO) method. SCO and eSCO packets do not use L2CAP and may be treated separately in the Bluetooth specification; therefore, the L2CAP parameters in Bluetooth are not applied to synchronous data. The eSCO/SCO links may utilize synchronous data, therefore, no start and stop bits may be used. Instead, a continual stream of data may be sent between two nodes. The application layer of the Bluetooth protocol may be utilized to facilitate audio arbitration.

The nomadic device may utilize caller ID (caller identification, CID), also called calling line identification (CLID), calling number delivery (CND), calling number identification (CNID) or calling line identification presentation (CLIP). Caller ID may be available in analog and digital phone systems. Caller ID may also be available on most voice over Internet Protocol (VoIP) applications that transmit a caller's number to the called party's telephone equipment during the ringing signal, or when the call is being set up but before the call is answered. When available, caller ID can also provide a name associated with the calling telephone number. The information made available to the called party may be displayed on a telephone's display, on a separately attached device, or be processed by an attached computer with appropriate interface hardware.

The nomadic device may send a CLIP with a header 305 indicating it may be utilized for non-traditional Bluetooth settings. The header distinguishes the CLIP from a typical phone call and may allow the VCS to utilize the CLIP to arbitrate audio or display other information. The VCS may analyze the CLIP and determine that audio arbitration may be utilized because of the header. The contents of the header may be an alpha-numeric number that may not typically be functional on a mobile phone, such as the number "99999" or "9*#12". Thus the contents are typically an alpha-numeric set that is incapable of establishing a phone call on a phone line. The nomadic device or application may then send a request to open the eSCO/SCO link 307. The nomadic device may send the open request when audio data, such as guidance instructions, or other data is ready for utilization with the VCS.

Upon receiving the CLIP with the header and the request to open eSCO/SCO link, the VCS may analyze the current audio source to determine if opening the audio session is appropriate. If the VCS determines that it is appropriate the audio session should be opened, the VCS may grant the request. However, if the VCS determines that the audio session should not be opened, the VCS will deny the request. In one illustrative example, the current audio source may be a phone call when the VCS receive the CLIP with the header. The VCS may determine that the request should not be granted, due to the phone call receiving prominence over the nomadic device's application. Therefore, the VCS may ignore the request to open or pass back data or a message to the nomadic device indicating the request to open could not be granted. However, if the VCS determines that the request should be granted, the VCS will initialize the audio session to be open between the nomadic device and the VCS.

Upon opening the eSCO/SCO link 307, the audio session will be open 309 between the VCS and the nomadic device. By opening of the audio session, the nomadic device may be allowed to stream audio to the VCS. The VCS may utilize AT commands or a Hayes command to make requests of data. AT commands or a Hayes command set can be utilized to command a modem, phone, or another nomadic device to complete certain commands. In one illustrative example of a command that may be utilized is CLCC, which is a request to list current calls. In an illustrative example, the VCS may request the CLCC command 313 based on the CLIP with the header.

Upon receiving the request of the CLCC from the VCS, the nomadic device may respond by either providing the CLCC 313 or ignoring the request. The nomadic device may respond with the CLCC that contains data indicative of information, such as turn by turn, weather, traffic, etc. The VCS may analyze the data upon receiving of the CLCC with the data. The VCS may transform the data for appropriate presentation on the HMI 317.

The nomadic device or application may also play the audio 319 upon opening the audio session. The nomadic device or application may begin to stream the audio data 319 via the Bluetooth connection. The VCS may then play the audio 321 or guidance instructions or other audible information through the vehicle's speakers. The audio arbitration executed by the VCS may also play the streamed audio over specific speakers or to a volume level relative to the current audio source played by the VCS.

The nomadic device may send a request to close the eSCO/SCO link when streaming of audio is completed by the application. The nomadic device may send a message to the VCS requesting that the link is terminated or closed 323. The VCS may analyze the need to leave the link open. If the VCS determines that the link is no longer needed to stream audio, the VCS will grant the request and close the eSCO/SCO link 325.

Figure 4:
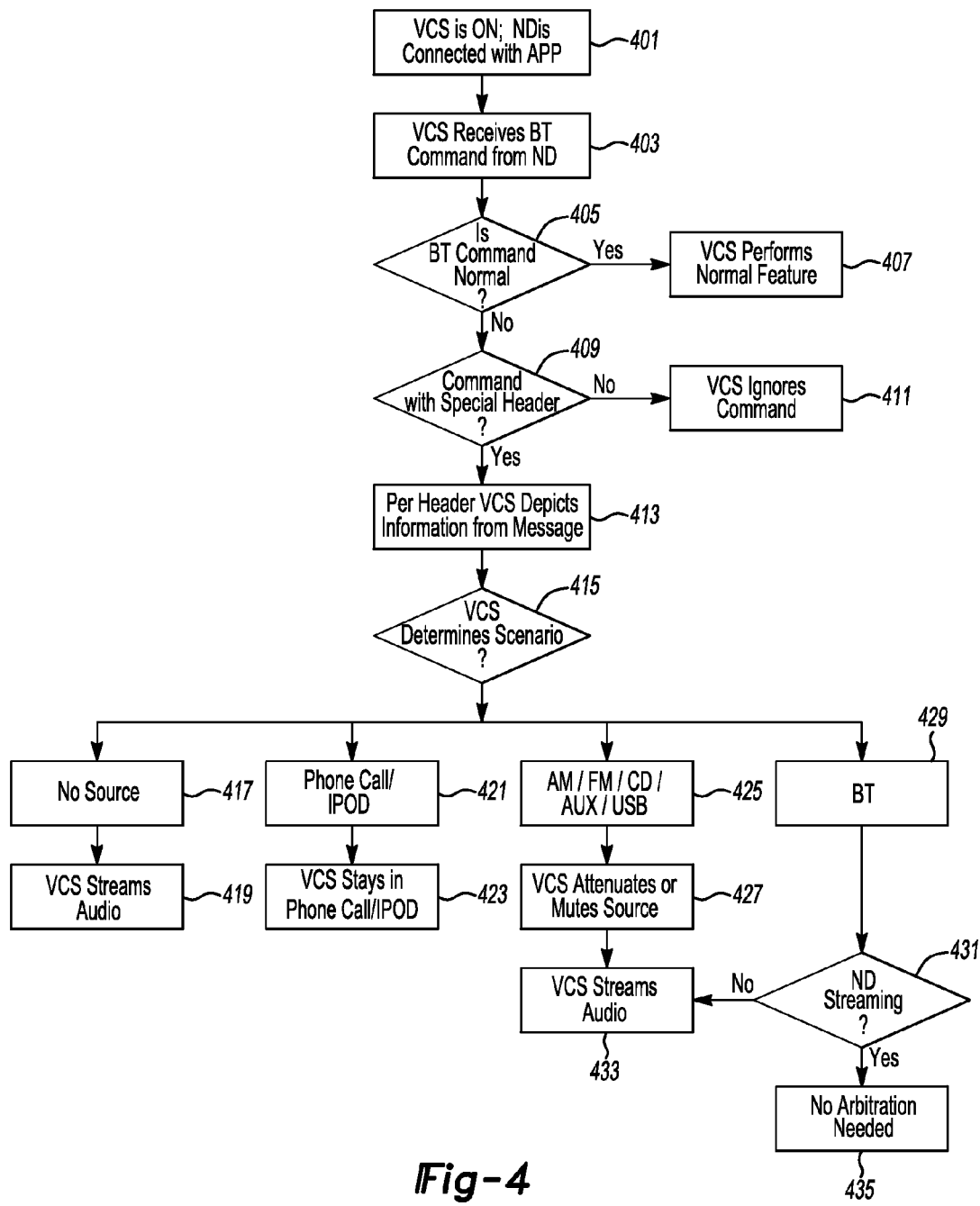
FIG. 4 shows an example flow chart of audio mixing/arbitration use case between a nomadic device and a vehicle based computing system.

FIG. 4 is in an illustrative flow chart of audio mixing/arbitration based on different use case scenarios. The VCS may be connected and communicating with a nomadic device that is running a navigation application 401. The VCS may be in communication with the nomadic device by a Bluetooth connection or another wireless connection. The VCS may then monitor for requests or commands that were sent from the nomadic device and receive the requests or commands from the nomadic device 403. Upon receiving a request from the nomadic device, the VCS may determine if the request or command is utilizing standard Bluetooth functionality 405. If the request or command is utilizing standard Bluetooth functionality 407, the VCS will perform the request with respect to the normal logic, HMI, and flow. However, if the request is not amongst a request consistent with the Bluetooth protocol, the VCS will analyze the request to determine if the request/command caries a header to indicate it is a specific to a certain application 409. The header may be sent utilizing AVRCP or eSCO/SCO method. Furthermore, the header may include AT commands to control the phone. AT commands or a Hayes command set can be utilized to command a modem or phone to complete certain commands. One illustrative example of a command that may be utilized is CLCC, which is a request to list current calls. The VCS may ignore the command 411 if the header is not found in the Bluetooth command.

According to the header, the VCS will depict information 413 via the AVRCP message dependent on the audio state/condition of the VCS 415. For example, if no audio source 417 is being utilized on the VCS, the VCS may use the HMI template designed for displaying information. The VCS may then play the audio streamed from the phone. The audio may be played over the vehicle speakers and indicate upcoming guidance or maneuver. The VCS may not need to arbitrate audio if no audio source is currently functioning.

In another illustrative example, if the VCS's current audio source is a phone call or an iPod 421, the VCS may ignore the audio prompt and leave the current audio source as the phone call or iPod 423 to prevent the user's conversation from being interrupted. The phone call may originate from the nomadic device or from another nomadic device or phone in the vehicle that is also connected to the VCS. In another scenario, the phone call's conversation may be muted and the navigation guidance may be output over the vehicle's speakers.

In another example, the VCS's current audio source may be a non-Bluetooth audio source, such as AM, FM, CD, Aux, USB, etc 425. Other in-vehicle audio sources 425 may be available as well (such as an MP3 player or disc changer). Upon receiving the AVRCP command with the header, the VCS may attenuate or mute the current source's audio 427 to allow the audio or guidance prompts to be played over the vehicle's speakers. Furthermore, it may use an HMI template designed for showing metadata to display turn by turn information carried in the AVRCP command. For example, if a right turn onto Michigan AVE is approaching, the audio prompt may say "Upcoming right turn onto Michigan Avenue." The HMI template designed may show a picture of a right turn arrow with a street sign of Michigan Avenue to depict the upcoming maneuver to the user. Audio data, picture data, text data, etc. may all be sent from the nomadic device to be utilized on the VCS.

In yet another example, the VCS's current audio source may be a Bluetooth audio source 429 streaming from the nomadic device. For example, the nomadic device may be streaming audio from a user's phone (e.g. Smartphone, iPhone, Android Phone, etc.) or digital audio player (e.g. iPod touch, etc.) while utilizing a navigation application on the nomadic device. The nomadic device's media player may stream audio via Bluetooth audio in order to utilize audio content off the nomadic device. The VCS and nomadic device may determine if the nomadic device is currently streaming audio 431. Upon determining that the VCS is currently streaming audio, the VCS may not attempt to arbitrate the audio and allow the nomadic device to handle the arbitration 435. If the phone is not streaming audio via Bluetooth, the VCS may display the information (e.g. turn by turn information) carried in the AVRCP command and/or stream the audio 433 over A2DP (advanced audio distribution profile). For example, if the current audio source is Bluetooth but the nomadic device is not streaming because it is paused or stopped, the VCS may stream the incoming audio.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A nomadic device for attenuating vehicle audio comprising:
    a wireless transceiver for communicating signals to the vehicle computing system for processing;
    a processor in communication with the wireless transceiver, the processor configured to:
        send a request of the nomadic device to play audio at a vehicle computer system;
        send a wireless signal to the vehicle computer system representative of an audible statement to be played at the vehicle computer system, wherein the audible statement is utilized by the vehicle computing system to determine an amount to attenuate vehicle audio based on one or more audio sources of the vehicle computer system and a time the wireless signal is received at the vehicle computer system; and
        output the audible statement to the vehicle computer system.

2. The system of claim 1, wherein the amount to attenuate the audio is zero.

3. The system of claim 1, wherein the nomadic device is further configured to send a caller identification string to the vehicle computer system identifying a mobile application corresponding to the audible statement.

4. The system of claim 3, wherein the caller identification string includes a calling line identification presentation.

5. The system of claim 3, wherein the caller identification string contains an alpha-numeric number that is incapable of making an operable phone-call to a phone line.

6. The system of claim 1, wherein the wireless signal sent to the vehicle computer system includes an AT command defining a list current call command.

7. The system of claim 1, wherein the processor is further configured to convert the wireless signal into metadata for transmission using an audio video remote control profile (AVRCP).

8. The system of claim 7, wherein the metadata includes at least one or more of a track, title, or album cover.

9. The system of claim 7, wherein the metadata includes a header indicating a mobile application requesting to utilize the vehicle computer system is certified.

10. A method for attenuating streaming audio in a vehicle, the method comprising:
    sending a wireless signal including a caller line identification to the vehicle using a nomadic device, wherein the wireless signal is representative of an audible statement to be played in the vehicle;
    streaming audio from a nomadic device to a vehicle computer system in a vehicle, wherein both the audio streamed from the nomadic device and the audible statement are used to determine an amount to attenuate the streaming audio; and
    outputting navigation information to the vehicle computer system using a Hayes command.

11. The method of claim 10, wherein the navigation information is at least one of turn by turn information, weather information, or traffic information.

12. The method of claim 10, wherein sending the wireless signal to the vehicle computer system utilizes an enhanced synchronous connection-oriented link.

13. The method of claim 10, wherein sending the wireless signal to the vehicle computer system utilizes a synchronous connection-oriented link.

14. The method of claim 10, wherein the caller identification is configured to identify a mobile application operating on the nomadic device.

15. The method of claim 10, wherein the caller identification includes a calling line identification presentation.

16. The method of claim 10, wherein the caller line identification includes a header utilized to distinguish the caller line identification from a phone call.

17. The method of claim 10, wherein the method further includes eliminating the attenuation of the streaming audio after playing the audible statement.

18. The method of claim 10, wherein the method further includes sending a request to the vehicle computer system to terminate a connection between the nomadic device and vehicle computer system upon completion of streaming audio.

19. The method of claim 10, wherein the method further includes sending a request to the vehicle computer system to open an audio channel.

20. A nomadic device comprising:
    a wireless transceiver communicating with a vehicle; and
    a processor configured to:
        play wireless audio at the vehicle using the wireless transceiver;
        send an audible statement to be output by the vehicle, wherein the audible statement is utilized by the vehicle to determine an attenuation of audio played at the vehicle; and
        outputting navigation information to the vehicle utilizing a Hayes command set.

* * * * *